United States Patent
Chen et al.

(10) Patent No.: US 10,461,118 B2
(45) Date of Patent: *Oct. 29, 2019

(54) METHOD FOR MAKING CMOS IMAGE SENSOR INCLUDING PHOTODIODES WITH OVERLYING SUPERLATTICES TO REDUCE CROSSTALK

(71) Applicant: ATOMERA INCORPORATED, Los Gatos, CA (US)

(72) Inventors: Yi-Ann Chen, Campbell, CA (US); Abid Husain, San Jose, CA (US); Hideki Takeuchi, San Jose, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 32 days.

This patent is subject to a terminal disclaimer.

(21) Appl. No.: 15/843,121

(22) Filed: Dec. 15, 2017

(65) Prior Publication Data
US 2019/0189676 A1  Jun. 20, 2019

(51) Int. Cl.
*H01L 27/146*  (2006.01)
*H01L 31/109*  (2006.01)
*H01L 31/0352*  (2006.01)

(52) U.S. Cl.
CPC .... *H01L 27/14689* (2013.01); *H01L 27/1463* (2013.01); *H01L 27/14621* (2013.01);
(Continued)

(58) Field of Classification Search
CPC ....... H01L 31/035254; H01L 27/14627; H01L 27/14685; H01L 31/1804; H01L 31/109;
(Continued)

(56) References Cited

U.S. PATENT DOCUMENTS

| 4,937,204 A | 6/1990 | Ishibashi et al. |
| 5,187,553 A | 2/1993 | Makita |

(Continued)

FOREIGN PATENT DOCUMENTS

GB  2347520  6/2000

OTHER PUBLICATIONS

U.S. Appl. No. 15/592,464, filed May 11, 2017.
(Continued)

*Primary Examiner* — William F Kraig
*Assistant Examiner* — Vicki B. Booker
(74) *Attorney, Agent, or Firm* — Allen, Dyer, Doppelt, + Gilchrist, P.A. Attorneys at Law

(57) ABSTRACT

A method for making a CMOS image sensor may include forming a plurality of laterally adjacent photodiodes on a semiconductor substrate having a first conductivity types by forming a retrograde well extending downward into the substrate from a surface thereof and having a second conductivity type, forming a first well around a periphery of the retrograde well also having the second conductivity type, and forming a second well within the retrograde well having the first conductivity type. Furthermore, first and second superlattices may be respectively formed overlying each of the first and second wells, with each of the first and second superlattices comprising a plurality of stacked groups of layers, and each group of layers comprising a plurality of stacked base semiconductor monolayers defining a base semiconductor portion and at least one non-semiconductor monolayer constrained within a crystal lattice of adjacent base semiconductor portions.

20 Claims, 11 Drawing Sheets

(52) U.S. Cl.
CPC .. *H01L 27/14627* (2013.01); *H01L 27/14645* (2013.01); *H01L 27/14685* (2013.01); *H01L 31/035236* (2013.01); *H01L 31/109* (2013.01)

(58) Field of Classification Search
CPC ........... H01L 27/14692; H01L 27/1463; H01L 27/1461; H01L 27/14645; H01L 27/14621; H01L 27/14689; H01L 31/035236
See application file for complete search history.

(56) References Cited

U.S. PATENT DOCUMENTS

| | | | |
|---|---|---|---|
| 5,216,262 A | 6/1993 | Tsu | |
| 5,357,119 A | 10/1994 | Wang et al. | |
| 5,610,416 A | 3/1997 | Su et al. | |
| 5,683,934 A | 11/1997 | Candelaria | |
| 5,796,119 A | 8/1998 | Seabaugh | |
| 6,141,361 A | 10/2000 | Mears et al. | |
| 6,376,337 B1 | 4/2002 | Wang | |
| 6,472,685 B2 | 10/2002 | Takagi | |
| 6,639,293 B2 | 10/2003 | Furumiya et al. | |
| 6,741,624 B2 | 5/2004 | Mears et al. | |
| 6,830,964 B1 | 12/2004 | Mears et al. | |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |
| 6,927,413 B2 | 8/2005 | Mears et al. | |
| 6,952,018 B2 | 10/2005 | Mears et al. | |
| 6,958,486 B2 | 10/2005 | Mears et al. | |
| 6,993,222 B2 | 1/2006 | Mears et al. | |
| 7,018,900 B2 | 3/2006 | Kreps | |
| 7,033,437 B2 | 4/2006 | Mears et al. | |
| 7,034,329 B2 | 4/2006 | Mears et al. | |
| 7,045,377 B2 | 5/2006 | Mears et al. | |
| 7,045,813 B2 | 5/2006 | Mears et al. | |
| 7,071,119 B2 | 7/2006 | Mears et al. | |
| 7,105,895 B2 | 9/2006 | Wang et al. | |
| 7,109,052 B2 | 9/2006 | Mears et al. | |
| 7,123,792 B1 | 10/2006 | Mears et al. | |
| 7,148,712 B1 | 12/2006 | Prey, Jr. et al. | |
| 7,153,763 B2 | 12/2006 | Hytha et al. | |
| 7,202,494 B2 | 4/2007 | Blanchard | |
| 7,227,174 B2 | 6/2007 | Mears et al. | |
| 7,229,902 B2 | 6/2007 | Mears et al. | |
| 7,265,002 B2 | 9/2007 | Mears et al. | |
| 7,279,699 B2 | 10/2007 | Mears et al. | |
| 7,279,701 B2 | 10/2007 | Kreps | |
| 7,288,457 B2 | 10/2007 | Kreps | |
| 7,303,948 B2 | 12/2007 | Mears et al. | |
| 7,432,524 B2 | 10/2008 | Mears et al. | |
| 7,435,988 B2 | 10/2008 | Mears et al. | |
| 7,436,026 B2 | 10/2008 | Kreps | |
| 7,446,002 B2 | 11/2008 | Mears et al. | |
| 7,446,334 B2 | 11/2008 | Mears et al. | |
| 7,491,587 B2 | 2/2009 | Rao | |
| 7,514,328 B2 | 4/2009 | Rao | |
| 7,517,702 B2 | 4/2009 | Halilov et al. | |
| 7,531,828 B2 | 5/2009 | Mears et al. | |
| 7,531,829 B2 | 5/2009 | Blanchard | |
| 7,531,850 B2 | 5/2009 | Blanchard | |
| 7,586,116 B2 | 9/2009 | Kreps et al. | |
| 7,586,165 B2 | 9/2009 | Blanchard | |
| 7,598,515 B2 | 10/2009 | Mears et al. | |
| 7,612,366 B2 | 11/2009 | Mears et al. | |
| 7,625,767 B2 | 12/2009 | Huang et al. | |
| 7,659,539 B2 | 2/2010 | Kreps et al. | |
| 7,682,865 B2 | 3/2010 | Razeghi | |
| 7,700,447 B2 | 4/2010 | Dukovski et al. | |
| 7,718,996 B2 | 5/2010 | Dukovski et al. | |
| 7,781,827 B2 | 8/2010 | Rao | |
| 7,812,339 B2 | 10/2010 | Mears et al. | |
| 7,863,066 B2 | 1/2011 | Mears et al. | |
| 7,880,161 B2 | 2/2011 | Mears et al. | |
| 7,928,425 B2 | 4/2011 | Rao | |
| 8,049,256 B2 | 11/2011 | Guidash | |
| 8,120,061 B2 | 2/2012 | Iguchi et al. | |
| 8,120,079 B2 | 2/2012 | Augusto | |
| 8,243,139 B2 | 8/2012 | Nagai et al. | |
| 8,389,974 B2 | 3/2013 | Mears et al. | |
| 8,987,751 B2 | 3/2015 | Ihara | |
| 9,123,843 B2 | 9/2015 | Kyono et al. | |
| 9,142,723 B2 | 9/2015 | Humphreys et al. | |
| 9,275,996 B2 | 3/2016 | Mears et al. | |
| 9,406,753 B2 | 8/2016 | Mears et al. | |
| 9,558,939 B1 | 1/2017 | Stephenson et al. | |
| 9,595,558 B2 | 3/2017 | Petilli | |
| 9,640,616 B2 | 5/2017 | Augusto | |
| 9,773,932 B2 | 9/2017 | Fujii et al. | |
| 2002/0063302 A1 | 5/2002 | Furumiya et al. | |
| 2003/0034529 A1 | 2/2003 | Fitzgerald et al. | |
| 2003/0057416 A1 | 3/2003 | Currie et al. | |
| 2005/0167709 A1 | 8/2005 | Augusto | |
| 2006/0220118 A1 | 10/2006 | Stephenson et al. | |
| 2006/0267130 A1 | 11/2006 | Rao | |
| 2007/0012910 A1 | 1/2007 | Mears et al. | |
| 2007/0020833 A1 | 1/2007 | Mears et al. | |
| 2008/0012004 A1 | 1/2008 | Huang et al. | |
| 2008/0083939 A1 | 4/2008 | Guidash | |
| 2008/0258134 A1 | 10/2008 | Mears et al. | |
| 2009/0173976 A1 | 7/2009 | Augusto | |
| 2011/0215299 A1 | 9/2011 | Rao | |
| 2012/0175636 A1 | 7/2012 | Ihara | |
| 2014/0319464 A1 | 10/2014 | Iguchi | |
| 2015/0115222 A1 | 4/2015 | Kyono et al. | |
| 2015/0129747 A1 | 5/2015 | Petilli | |
| 2015/0357414 A1 | 12/2015 | Mears | |
| 2016/0099317 A1 | 4/2016 | Mears et al. | |
| 2016/0149023 A1 | 5/2016 | Mears et al. | |
| 2016/0197146 A1* | 7/2016 | Augusto | ................. H01L 29/68 257/22 |
| 2016/0336406 A1 | 11/2016 | Mears et al. | |
| 2016/0336407 A1 | 11/2016 | Mears et al. | |
| 2016/0356718 A1 | 12/2016 | Yoon et al. | |
| 2016/0358773 A1 | 12/2016 | Mears et al. | |
| 2017/0294514 A1 | 10/2017 | Mears | |
| 2017/0301757 A1 | 10/2017 | Mears et al. | |
| 2017/0330609 A1 | 11/2017 | Roy | |

OTHER PUBLICATIONS

U.S. Appl. No. 15/664,028, filed Jul. 31, 2017.
U.S. Appl. No. 15/670,231, filed Aug. 7, 2017.
U.S. Appl. No. 15/670,240, filed Aug. 7, 2017.
U.S. Appl. No. 15/670,266, filed Aug. 7, 2017.
U.S. Appl. No. 15/670,274, filed Aug. 7, 2017.
U.S. Appl. No. 15/678,616, filed Aug. 16, 2017.
U.S. Appl. No. 15/678,658, filed Aug. 16, 2017.
U.S. Appl. No. 15/842,981, filed Dec. 15, 2017.
U.S. Appl. No. 15/842,989, filed Dec. 15, 2017.
U.S. Appl. No. 15/842,990, filed Dec. 15, 2017.
U.S. Appl. No. 15/842,993, filed Dec. 15, 2017.
U.S. Appl. No. 15/843,013, filed Dec. 15, 2017.
U.S. Appl. No. 15/843,017, filed Dec. 15, 2017.
U.S. Appl. No. 15/843,044, filed Dec. 15, 2017.
U.S. Appl. No. 15/843,077, filed Dec. 15, 2017.
U.S. Appl. No. 15/843,106, filed Dec. 15, 2017.
U.S. Appl. No. 15/843,113, filed Dec. 15, 2017.
U.S. Appl. No. 15/843,136, filed Dec. 15, 2017.
Bigas et al. "Review of CMOS image sensors" Microelectronics Journal; vol. 37, Issue 5, May 2006, pp. 433-451, Abstract Only.
Boukhayma et al. "Noise Reduction Techniques and Scaling Effects towards Photon Counting CMOS Image Sensors" Sensors 2016, 16(4), 514, pp. 21.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolay-

(56) References Cited

OTHER PUBLICATIONS ers of oxygen" IEEE silicon Nanoetectronics Workshop (2012): (Date of conference Jun. 10-11, 2012) pp. 2.

Mheen et al. "Negative Offset Operation of Four-Transistor CMOS Image Pixels for Increased Well Capacity and Suppressed Dark Current" IEEE Electron Device Letters; vol. 29, Issue: 4, Apr. 2008, Abstract Only.

Novikov et al. "Silicon-based Optoelectronics" 1999-2003, pp. 1-6.

R. Tsu Phenomena in silicon nanostructure device published online Sep. 6, 2000 by Applied Physics and Materials Science & Processing, pp. 391-402.

Raphael Tsu "Si Based Green ELD: Si-Oxygen Superlattice" wysiwyg://1/http://www3.interscience.wiley.com/cgi-bin/abstract/72512946/start: published online Jul. 21, 2000; 2 pgs. Abstract Only.

Richardson, et al. "Low Dark Count Single-Photon Avalanche Diode Structure Compatible With Standard Nanometer Scale CMOS Technology" IEEE Photonics Technology Letters; vol. 21, Issue: 14, Jul. 15, 2009, Abstract Only.

Um et al. "Design and Evaluation of a CMOS Image Sensor with Dual-CDS and Column-parallel SS-ADCs" Journal of Semiconductor Technology and Science, vol. 17, No. 1, Feb. 2017. pp. 10.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from Internet Jan. 18, 2016.

Xu et al. "Extension of planar bulk n-channel MOSFET scaling with oxygen insertion technology" IEEE Transactions on Electron devices, vol. 61, No. 9; Sep. 2014. pp. 3345-3349.

Xu et al., "MOSFET performance and scalability enhancement by insertion of oxygen layers", Department of Electrical Engineering and Computer Science, University of California, Berkeley, 2012, pp. 1-4.

Yamashita et al. "Dark noise in a CMOS imager pixel with negative bias on transfer gate" Proceedings vol. 7875, Sensors, Cameras, and Systems for Industrial, Scientific, and Consumer Applications XII; 78750J (2011); Abstract Only.

\* cited by examiner

METHOD FOR MAKING CMOS IMAGE SENSOR INCLUDING PHOTODIODES WITH OVERLYING SUPERLATTICES TO REDUCE CROSSTALK

TECHNICAL FIELD

The present disclosure generally relates to semiconductor devices and, more particularly, to CMOS image sensors.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a CMOS image sensor may include forming a plurality of laterally adjacent photodiodes on a semiconductor substrate having a first conductivity type by forming a retrograde well extending downward into the substrate from a surface thereof and having a second conductivity type, forming a first well around a periphery of the retrograde well also having the second conductivity type, and forming a second well within the retrograde well having the first conductivity type. Furthermore, first and second superlattices may be respectively formed overlying each of the first and second wells, with each of the first and second superlattices comprising a plurality of stacked groups of layers, and each group of layers comprising a plurality of stacked base semiconductor monolayers defining a base semiconductor portion and at least one non-semiconductor monolayer constrained within a crystal lattice of adjacent base semiconductor portions.

More particularly, the first well may define a ring, and the second well may be within the ring. Forming the second well may include forming a lower portion and an upper portion, the upper portion having a higher dopant concentration than the lower portion. The method may also include forming a shallow trench isolation (STI) region between the first and second wells. In addition, a respective STI region may for formed between laterally adjacent photodiodes. The method may further include forming a respective microlens overlying each of the photodiodes. In accordance with another example aspect, the method may further include forming a respective color lens overlying each of the photodiodes.

By way of example, the first and second superlattices may each further include a semiconductor cap layer thereon. Also by way of example, the at least one non-semiconductor monolayer may comprise oxygen, and the semiconductor monolayers may comprise silicon.

DETAILED DESCRIPTION

Figure 1:
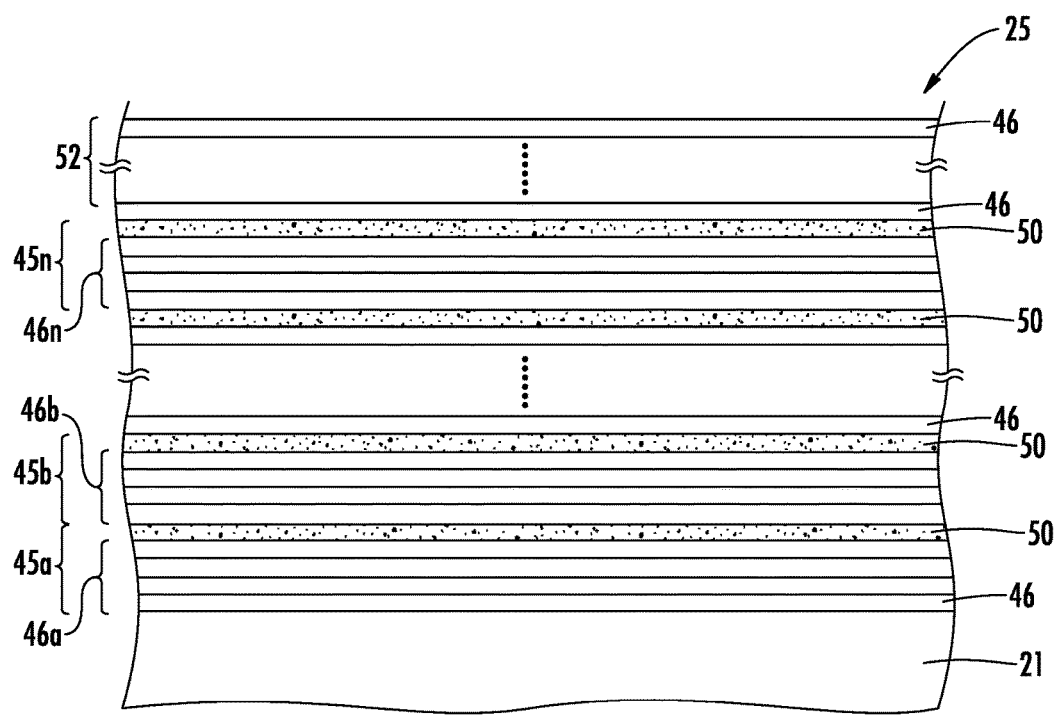
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to CMOS image sensors having an enhanced semiconductor superlattice therein which may provide improved retrograde well profiles and reduced crosstalk between adjacent pixels. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) =$$
$$\frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
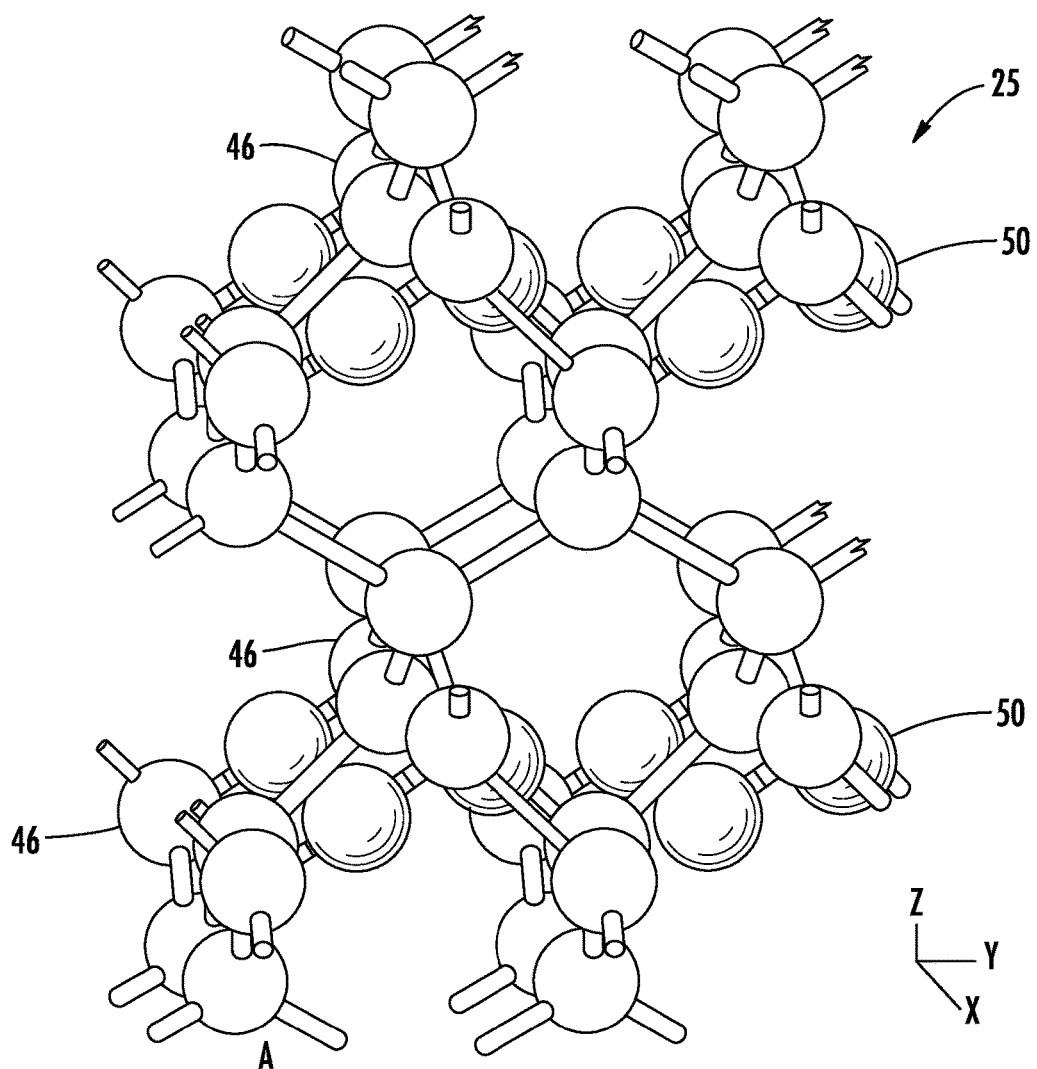
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
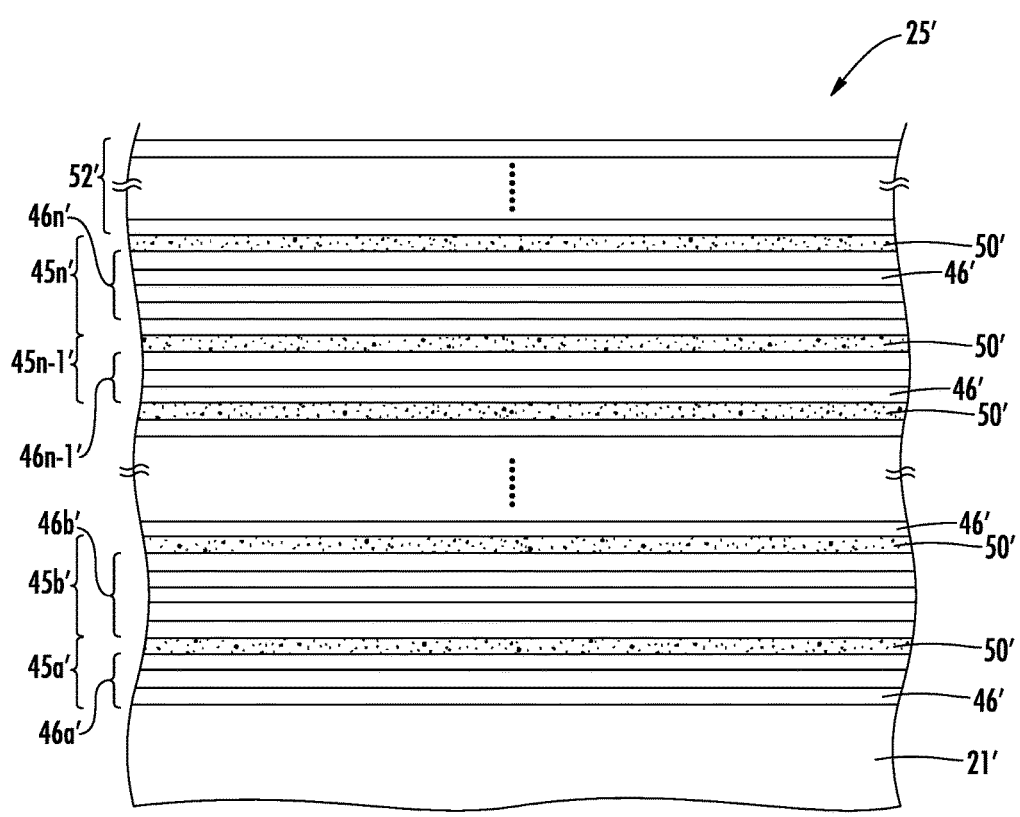
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
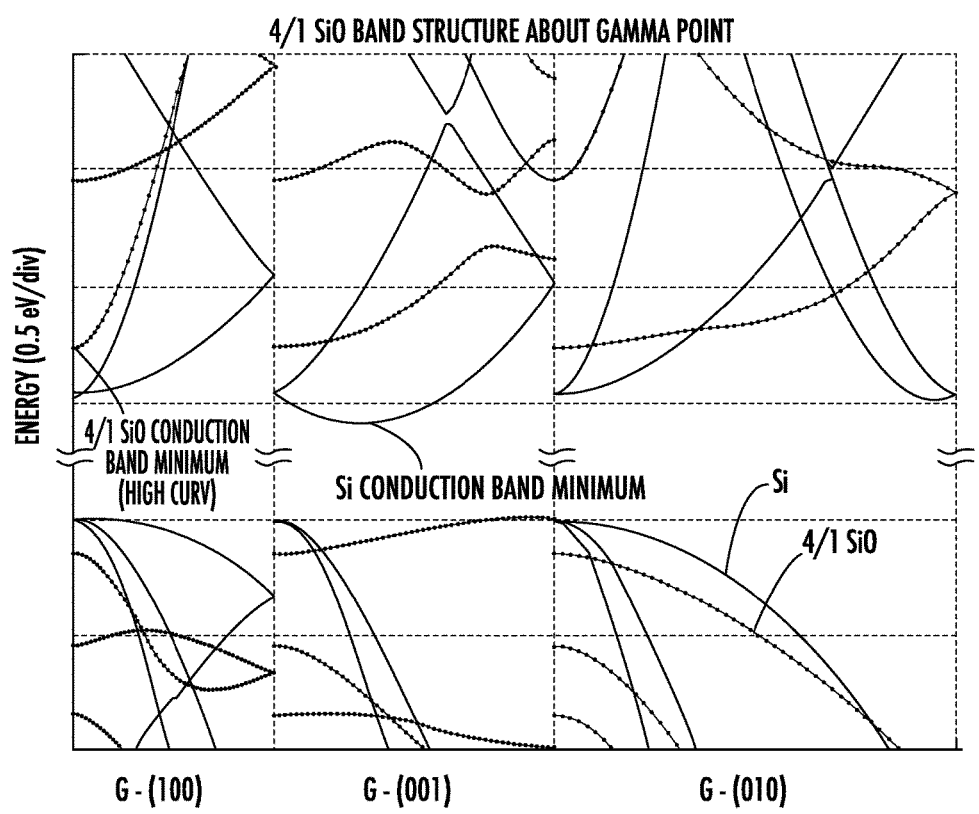
FIG. 4A is a graph of the calculated band structure from the gamma point (G) for both bulk silicon as in the prior art, and for the 4/1 Si/O superlattice as shown in FIGS. 1-2.
Figure 4B:
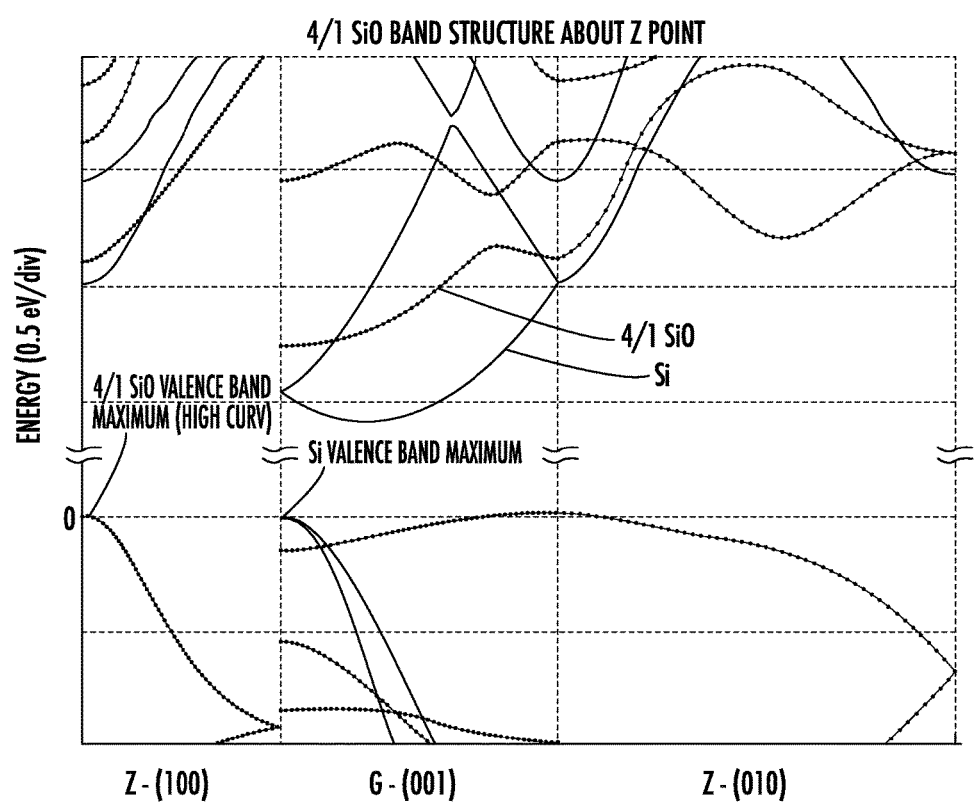
FIG. 4B is a graph of the calculated band structure from the Z point for both bulk silicon as in the prior art, and for the 4/1 Si/O superlattice as shown in FIGS. 1-2.
Figure 4C:
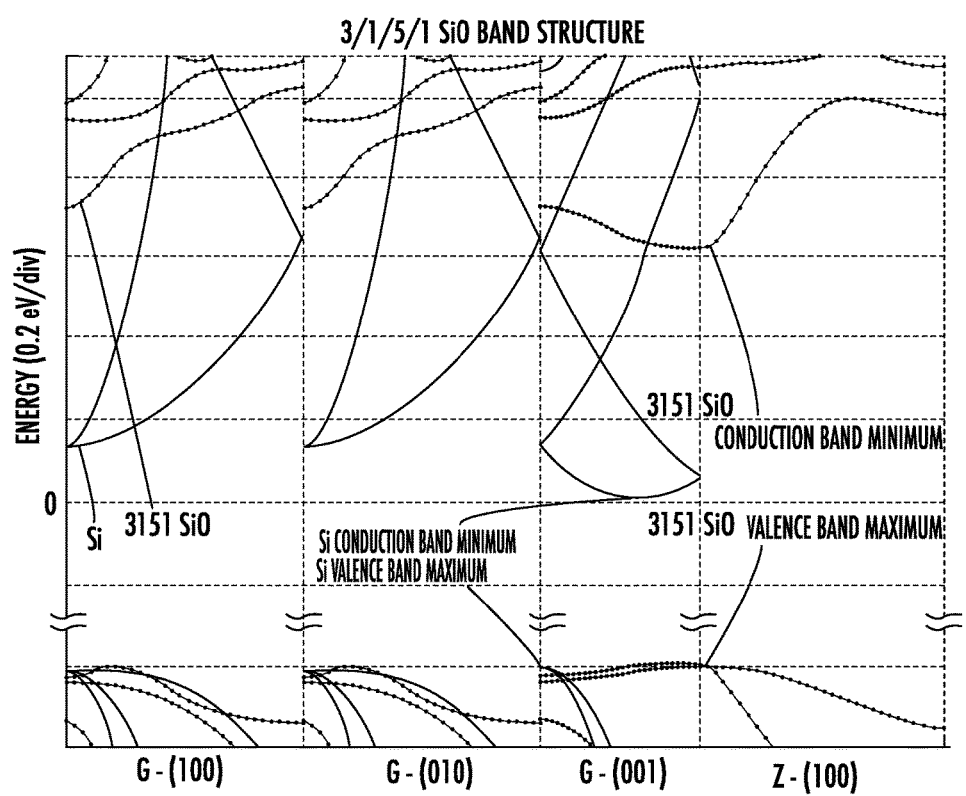
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
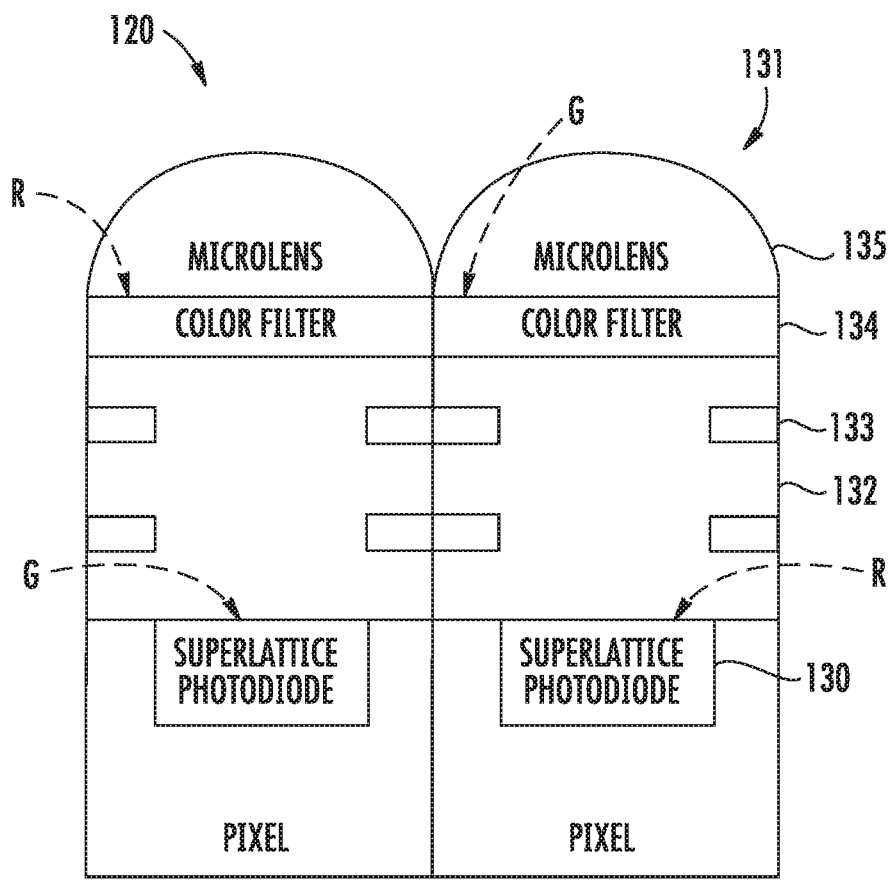
FIG. 5 is a schematic diagram of a CMOS image sensor including photodiodes with superlattice layers therein in accordance with an example embodiment.

Turning now to FIG. 5, the above-described superlattice structures may be incorporated into photodiodes 130 within respective pixels 131 of a CMOS image sensor 120 to advantageously help prevent "crosstalk" between adjacent pixels, as will be discussed further below. More particularly, each pixel 131 illustratively includes an insulating film 132 overlying the photodiode 130 with metal regions 133 within the insulting film. Each pixel further illustratively includes a color filter 134 overlying the insulating layer 132, and a microlens 135 overlying the color filter. Each color filter 134 is fabricated to allow a desired wavelength of light (e.g., red, green, etc.) to pass while excluding others. In the example illustrated in FIG. 5, the pixel 131 on the left has a green color filter 134 (i.e., it passes green light), while the pixel on the right has a red color filter (i.e., it passes red light). The metal regions 133, which are used for signal transmission, cause light reflection within the pixels 131 that results in undesirable optical crosstalk with respect to the photodiodes 130.

Figure 6:
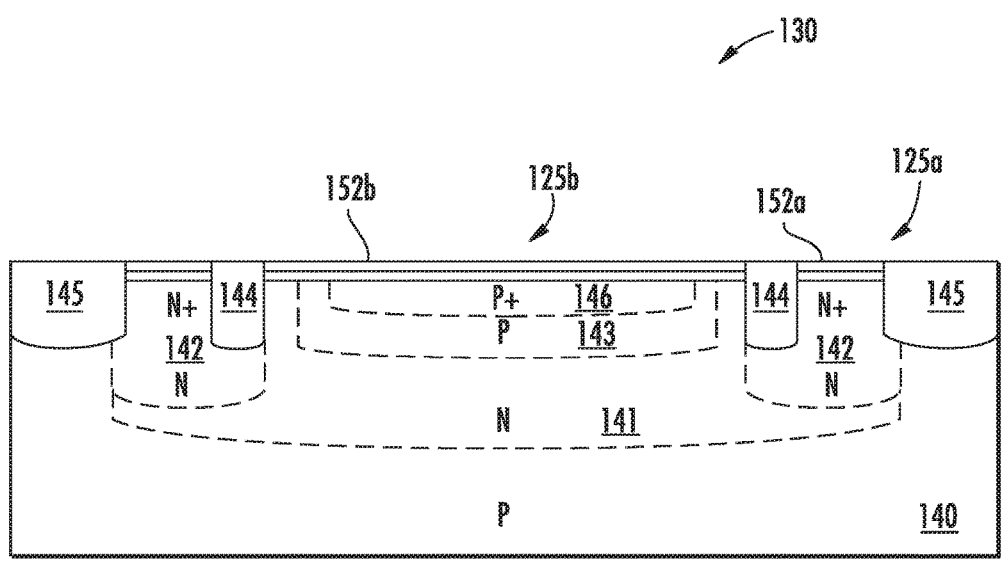
FIG. 6 is a schematic cross sectional diagram of an example photodiode including superlattice layers which may be used in the CMOS image sensor of FIG. 5.
Figure 7:
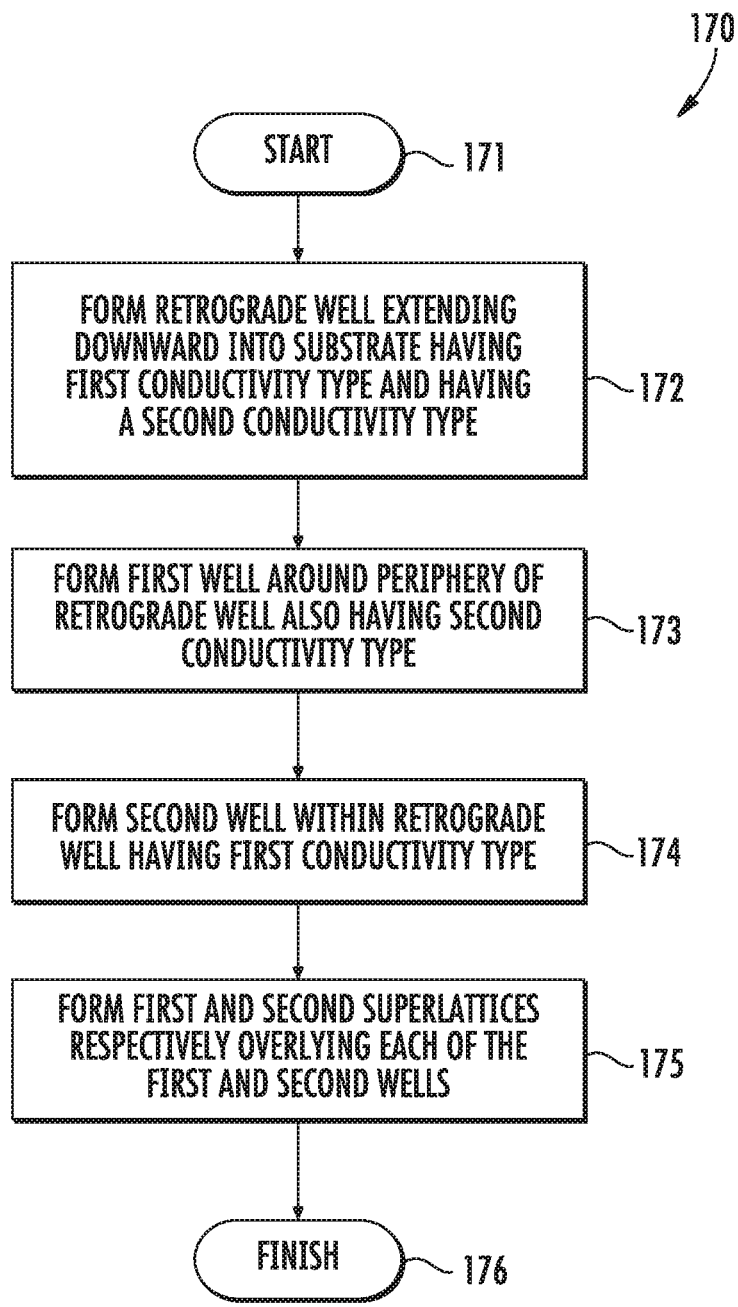
FIG. 7 is a flow diagram illustrating an example method for making the photodiode of FIG. 6.

Referring additionally to FIG. 6 and the flow diagram 170 of FIG. 7, a first example photodiode 130 which may be used in the pixels 131 and associated method for making the photodiode are now described. Beginning at Block 171, the photodiodes 130 are fabricated by forming a retrograde well 141 (e.g., by doping with an appropriate dopant) extending downward into a semiconductor substrate 140 (e.g., silicon) from a surface thereof and having a different conductivity type than the substrate (Block 172). Here, the substrate 140 is P-type, and the retrograde well 141 is N-type, although the conductivity types shown in FIG. 6 may be reversed in other embodiments. Furthermore, a first well 142 is formed as a ring around a periphery of the retrograde well 141, at Block 173, which also has the same conductivity type as the retrograde well (here N-type).

Furthermore, a second well 143 is formed or doped within the retrograde well 141 having the opposite conductivity type of the retrograde well (here P type), at Block 174. More particularly, in the illustrated example, the first well 142 is more heavily doped (N+) near the top, as is an upper portion 146 of the second well 143 (P+). Additionally, first and second superlattices 125a, 125b are respectively formed overlying each of the first and second wells 142, 143, at Block 175. The superlattices 125a, 125b may be selectively formed as described above with respect to FIGS. 1-4C between shallow trench isolation (STI) regions 144, 145, which may be formed by etching and filling trenches with an oxide (e.g., silicon dioxide, $SiO_2$) prior to the superlattice layer formation. However, in some embodiments, a blanket deposition of a superlattice layer may be formed over the upper surface of the substrate 140, and the STI regions 144, 145 formed thereafter through the blanket superlattice layer. The method of FIG. 7 illustratively concludes at Block 176. Further processing steps may include forming the insulation layer 132 and metal regions 133, color filters 134, and microlens 135 as described above to complete the CMOS image sensor 120. Also in the illustrated example, the second well 143 is laterally spaced apart from the STI region 144, although it may extend laterally to the STI region 144 in some embodiments.

The superlattice layers 125a, 125b may have respective semiconductor caps 152a, 152b with thickness in range of approximately 3 to 20 nm, for example, although other thicknesses may be used in different embodiments. In a typical pixel formation process, as insulating oxide is formed over the photodiode, silicon interstitials are injected from the surface of the substrate which "smear" out retrograde well profiles. However, the non-semiconductor monolayers within the superlattices 125a, 125b advantageously trap these interstitials near the surface to accordingly retain steep retrograde well profiles defined by the well implantations, and thereby help stop crosstalk between the pixels 131 for front side illumination (FSI) CMOS image sensors. That is, the superlattices 125a, 125b trap interstitials injected from the surface during oxidation processing, to thereby retain the desired retrograde profile defined by ion implantation.

Figure 8:
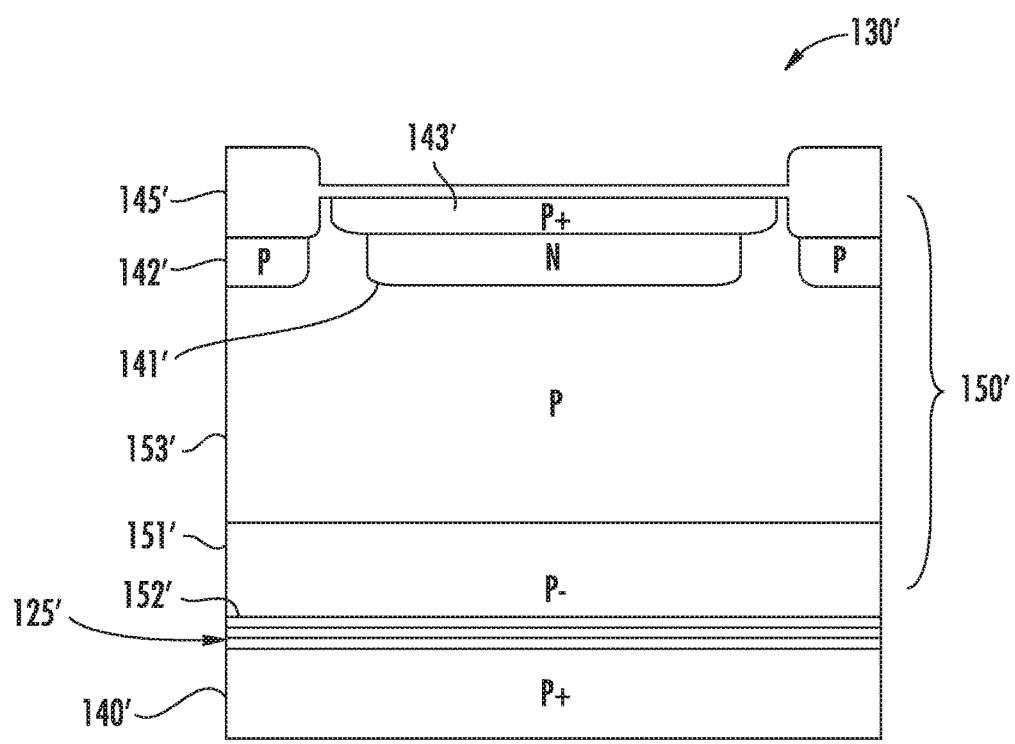
FIG. 8 is a schematic cross sectional diagram of another example photodiode including superlattice layers which may be used in the CMOS image sensor of FIG. 5.
Figure 9:
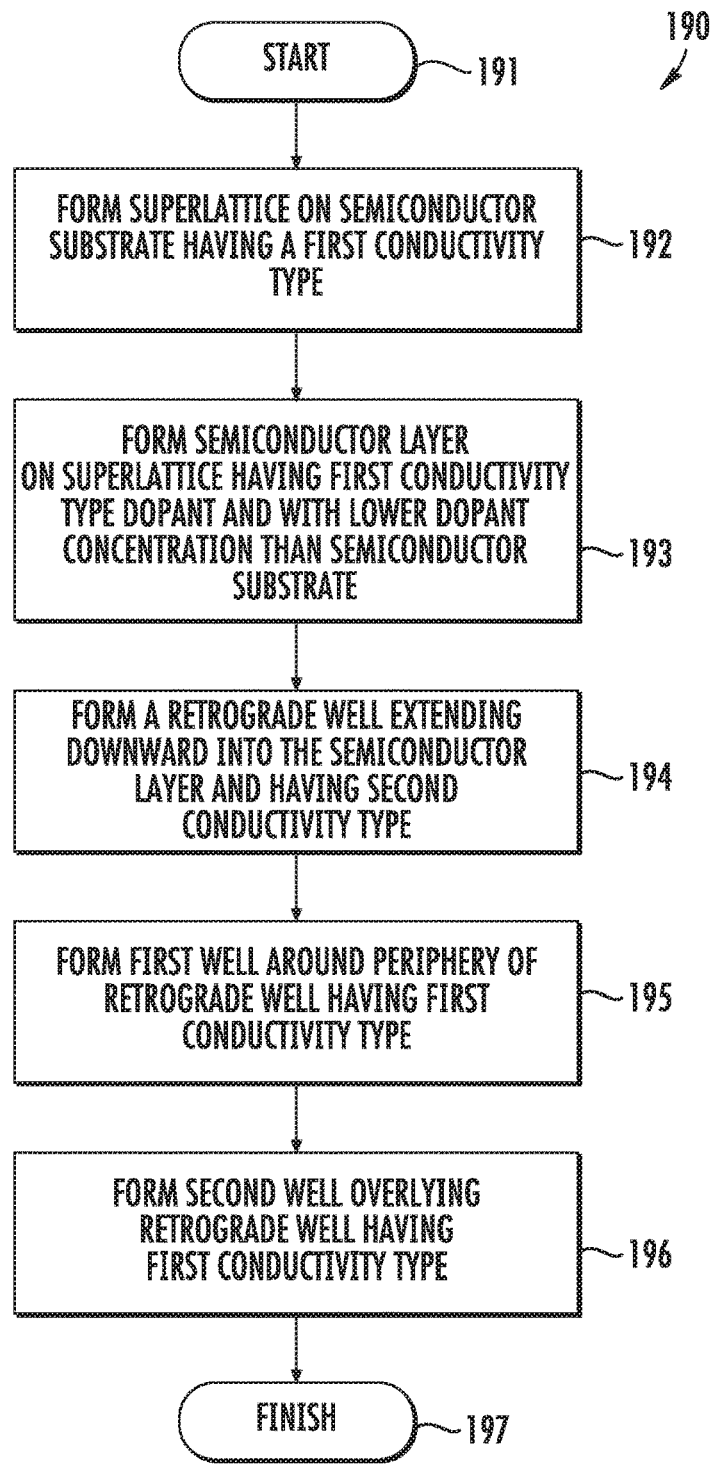
FIG. 9 is a flow diagram illustrating an example method for making the photodiode of FIG. 8.

Another example photodiode 130' and associated method are now described with reference to FIG. 8 and the flow diagram 190 of FIG. 9. Beginning at Block 191, a blanket superlattice 125' is deposited on a substrate 140', at Block 192. Here again, the superlattice 125' may be formed as described above with reference to FIGS. 1-4C. Next, a semiconductor layer 150' is formed on the superlattice 125', at Block 193. In the illustrated example, the substrate 140' is highly-doped P-type (P+), and the semiconductor layer 150' is also P-type but lightly doped (P−) in a lower portion 151', and has an intermediate doping level (P) in an upper portion 153'. As noted above, the semiconductor layer 150' may advantageously be single crystal, as epitaxial semiconductor growth may continue from the substrate 140' through the superlattice 150'. Moreover, the conductivity types shown in FIG. 8 may be reversed in different embodiments.

Furthermore, a retrograde well 141' is formed extending downward into the semiconductor layer 150' from a surface thereof and having an N-type conductivity dopant, at Block 194, followed by a first well 142' forming a ring around a periphery of the retrograde well and having P-type conductivity, at Block 195. Furthermore, a second well 143' is formed within or above the retrograde well 141' having P-type conductivity, at Block 196, which illustratively concludes the method shown in FIG. 9 (Block 197). Further processing may include the forming of STI regions 145', as well as forming the insulation layer 132 and metal regions 133, color filters 134, and microlens 135 as described above to complete the CMOS image sensor 120.

By way of example, the superlattice 125' may have a cap 152' of approximately 2 to 10 um, although other thicknesses may be used in different embodiments. The superlattice 125' advantageously blocks dopant (e.g., boron) diffusion from the substrate (P+) to the lower portion 151' (P−) to thereby improve retrograde quality. Moreover, it also helps to block metal diffusion to improve carrier lifetime in the retrograde well 143', as will be appreciated by those skilled in the art.

As a result, the photodiode 130' may also advantageously reduce crosstalk for FSI CMOS image sensor applications. That is, the superlattice 125' may again improve the final retrograde well profile via its diffusion blocking effects to thereby improve crosstalk between adjacent pixels 131. It should be noted that the order of certain steps (e.g., the order of well doping steps) may be changed in different embodiments that what is shown in the examples of FIGS. 7 and 9, as will be appreciated by those skilled in the art.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that other modifications and embodiments are intended to be included within the scope of the appended claims.

That which is claimed is:

1. A method for making a CMOS image sensor comprising:
   forming a plurality of laterally adjacent photodiodes on a semiconductor substrate having a first conductivity type by
      forming a retrograde well extending downward into the substrate from a surface thereof and having a second conductivity type,
      forming a first well around a periphery of the retrograde well also having the second conductivity type,
      forming a second well within the retrograde well having the first conductivity type, and
      forming first and second superlattices respectively overlying each of the first and second wells, each of the first and second superlattices comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

2. The method of claim 1 wherein the first well defines a ring, and wherein the second well is within the ring.

3. The method of claim 1 wherein forming the second well comprises forming a lower portion and an upper portion, the upper portion having a higher dopant concentration than the lower portion.

4. The method of claim 1 further comprising forming a shallow trench isolation (STI) region between the first and second wells.

5. The method of claim 1 further comprising forming a respective shallow trench isolation (STI) region between laterally adjacent photodiodes.

6. The method of claim 1 further comprising forming a respective microlens overlying each of the photodiodes.

7. The method of claim 1 further comprising forming a respective color lens overlying each of the photodiodes.

8. The method of claim 1 wherein the first and second superlattices each further comprises a semiconductor cap layer thereon.

9. The method of claim 1 wherein the at least one non-semiconductor monolayer comprises oxygen.

10. The method of claim 1 wherein the semiconductor monolayers comprise silicon.

11. A method for making a CMOS image sensor comprising:
   forming a plurality of laterally adjacent photodiodes on a semiconductor substrate having a first conductivity type by forming a retrograde well extending downward into the substrate from a surface thereof and having a second conductivity type, forming a first well around a periphery of the retrograde well also having the second conductivity type, forming a second well within the retrograde well having the first conductivity type, and forming first and second superlattices respectively overlying each of the first and second wells, each of the first and second superlattices comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions;

forming a respective color lens overlying each of the photodiodes; and forming a respective microlens overlying each of the color lenses.

12. The method of claim 11 wherein the first well defines a ring, and wherein the second well is within the ring.

13. The method of claim 11 wherein forming the second well comprises forming a lower portion and an upper portion, the upper portion having a higher dopant concentration than the lower portion.

14. The method of claim 11 further comprising forming a shallow trench isolation (STI) region between the first and second wells.

15. A method for making a CMOS image sensor comprising:

forming a plurality of laterally adjacent photodiodes on a semiconductor substrate by forming a retrograde well extending downward into the substrate from a surface thereof and having a second conductivity type, forming a first well around a periphery of the retrograde well also having the second conductivity type, forming a second well within the retrograde well having the first conductivity type, and forming first and second superlattices respectively overlying each of the first and second wells, each of the first and second superlattices comprising a plurality of stacked groups of layers, each group of layers comprising a plurality of stacked base silicon monolayers defining a base semiconductor portion, and at least one oxygen monolayer constrained within a crystal lattice of adjacent base silicon portions.

16. The method of claim 15 wherein the first well defines a ring, and wherein the second well is within the ring.

17. The method of claim 15 wherein forming the second well comprises forming a lower portion and an upper portion, the upper portion having a higher dopant concentration than the lower portion.

18. The method of claim 15 further comprising forming a shallow trench isolation (STI) region between the first and second wells.

19. The method of claim 15 further comprising forming a respective microlens overlying each of the photodiodes.

20. The method of claim 15 further comprising forming a respective color lens overlying each of the photodiodes.

* * * * *

UNITED STATES PATENT AND TRADEMARK OFFICE
CERTIFICATE OF CORRECTION

PATENT NO. : 10,461,118 B2  
APPLICATION NO. : 15/843121  
DATED : October 29, 2019  
INVENTOR(S) : Chen et al.

Page 1 of 1

It is certified that error appears in the above-identified patent and that said Letters Patent is hereby corrected as shown below:

On the Title Page

Item (57)   Delete the entire Abstract
Insert the following Abstract: --A method for making a CMOS image sensor may include forming a plurality of laterally adjacent photodiodes on a semiconductor substrate having a first conductivity type by forming a retrograde well extending downward into the substrate from a surface thereof and having a second conductivity type, forming a first well around a periphery of the retrograde well also having the second conductivity type, and forming a second well within the retrograde well having the first conductivity type. Furthermore, first and second superlattices may be respectively formed overlying each of the first and second wells, with each of the first and second superlattices comprising a plurality of stacked groups of layers, and each group of layers comprising a plurality of stacked base semiconductor monolayers defining a base semiconductor portion and at least one non-semiconductor monolayer constrained within a crystal lattice of adjacent base semiconductor portions.--

Signed and Sealed this
Tenth Day of December, 2019

Andrei Iancu
*Director of the United States Patent and Trademark Office*